United States Patent
Wang

(10) Patent No.: US 9,570,473 B2
(45) Date of Patent: Feb. 14, 2017

(54) ARRAY SUBSTRATE, MANUFACTURING METHOD THEREOF AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventor: Kai Wang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/429,928

(22) PCT Filed: May 26, 2014

(86) PCT No.: PCT/CN2014/078456
§ 371 (c)(1),
(2) Date: Mar. 20, 2015

(87) PCT Pub. No.: WO2015/090000
PCT Pub. Date: Jun. 25, 2015

(65) Prior Publication Data
US 2016/0027799 A1    Jan. 28, 2016

(30) Foreign Application Priority Data
Dec. 16, 2013    (CN) .......................... 2013 1 0689196

(51) Int. Cl.
*H01L 27/12* (2006.01)
*G02F 1/1345* (2006.01)
*G02F 1/1333* (2006.01)

(52) U.S. Cl.
CPC .......... *H01L 27/124* (2013.01); *G02F 1/13458* (2013.01); *H01L 27/1248* (2013.01); *H01L 27/1259* (2013.01); *G02F 1/133345* (2013.01)

(58) Field of Classification Search
CPC ........ H01L 33/08; H01L 33/58; H01L 27/124; H01L 27/1248; H01L 27/1259; G02F 1/13458
(Continued)

(56) References Cited

U.S. PATENT DOCUMENTS

2008/0030671 A1    2/2008  You
2011/0156995 A1    6/2011  Choi et al.
(Continued)

FOREIGN PATENT DOCUMENTS

CN    101442060 A    5/2009
CN    102141710 A    8/2011
(Continued)

OTHER PUBLICATIONS

First Chinese Office Action dated Aug. 28, 2015; Appln. No. 201310689196.5.
(Continued)

*Primary Examiner* — Nathan W Ha
(74) *Attorney, Agent, or Firm* — Ladas & Parry LLP

(57) ABSTRACT

An array substrate, a manufacturing method thereof and a display device are disclosed. The manufacturing method of an array substrate including: forming patterns including a thin film transistor, a gate wiring and a data wiring on the base substrate; the gate wiring and the data wiring are located in a PAD area; forming patterns of an insulating spacing layer, a first transparent electrode and a passivation layer, and forming a first via hole and a second via hole in areas corresponding to the gate wiring and the data wiring respectively to expose the gate wiring and the data wiring;
(Continued)

a thickness of the insulating spacing layer in the PAD area on the array substrate is less than that of the insulating spacing layer in other areas. Therefore, the connection electrode can make better contact with the corresponding signal lines to avoid abnormal rubbing mura.

12 Claims, 3 Drawing Sheets

(58) Field of Classification Search
  USPC .......................................................... 257/72
  See application file for complete search history.

(56) References Cited

U.S. PATENT DOCUMENTS

| | | | |
|---|---|---|---|
| 2012/0142128 A1 | 6/2012 | Kwon | |
| 2012/0162162 A1* | 6/2012 | Kong | H01L 27/1288 345/205 |
| 2012/0162557 A1* | 6/2012 | Nakazawa | G02F 1/136227 349/38 |
| 2012/0256186 A1* | 10/2012 | Park | H01L 27/3276 257/72 |
| 2012/0299016 A1* | 11/2012 | Choi | C23C 14/042 257/79 |
| 2013/0029446 A1* | 1/2013 | Kim | H01L 27/124 438/34 |
| 2013/0032829 A1* | 2/2013 | Sung | C23C 14/12 257/88 |
| 2013/0063673 A1* | 3/2013 | Choi | G02F 1/136227 349/43 |
| 2013/0087794 A1* | 4/2013 | Kwack | H01L 27/1288 257/59 |
| 2014/0175442 A1 | 6/2014 | Kwack et al. | |

FOREIGN PATENT DOCUMENTS

| | | |
|---|---|---|
| CN | 102707523 A | 10/2012 |
| CN | 103681488 A | 3/2014 |
| CN | 103901679 A | 7/2014 |

OTHER PUBLICATIONS

International Search Report Appln. No. PCT/CN2014078456; Dated Sep. 24, 2014.
Written Opinion of the International Searching Authority Appln. No. PCT/CN2014/078456; Dated Sep. 24, 2014.
Second Chinese Office Action Appln. No. 201310689196.5; Dated Mar. 4, 2016.

* cited by examiner

ARRAY SUBSTRATE, MANUFACTURING METHOD THEREOF AND DISPLAY DEVICE

TECHNICAL FILED

Embodiments of the present disclosure relate to an array substrate, a manufacturing method thereof and a display device.

BACKGROUND

In recent years, with the increasing requirements on the display effect, the value of PPI (pixels per inch) of a liquid crystal display is increased continuously, so more pixels are needed to arrange in per unit area of the display screen, and correspondingly more wirings are needed. Accordingly, the capacitance and resistance among metal layers will be multiplied. Therefore, time delay and power dissipation become obvious, which will notably affect the usage of customers; moreover, it is contrary to the popular trend of energy conservation and environment protection nowadays. In order to decrease the capacitance between metal layers, it is needed to adopt a thicker insulating material with a lower dielectric constant. If the thickness of the inorganic insulating material prepared by CVD (chemical vapor deposition) method is increased, the requirements on production cost and process will become very high, and especially the technical problem brought by etching is hard to avoid. Meanwhile, the process time will be increased. So the yield will be affected to a large extent, and the competitive edge of an enterprise will be reduced. By contrast, selection of an organic insulating material brings about the obvious effects such as simple production process, lower cost, easy adjustment of thickness and decreased power dissipation. Meanwhile, the load of the common electrode is reduced and the undesirable greenish display will be improved.

SUMMARY

Embodiments of the present disclosure provide an array substrate, a manufacturing method thereof and a display device, to avoid generating insufficient contact after the second transparent electrode are formed and avoid generating abnormal rubbing mura.

At least one of the embodiments of the present disclosure provide a manufacturing method of an array substrate, comprising: forming patterns comprising a thin film transistor, a gate wiring and a data wiring on a base substrate, wherein the gate wiring and the data wiring are located in a peripheral area surrounding a display area of the array substrate; forming patterns of an insulating spacing layer, a first transparent electrode and a passivation layer, and forming a first via hole and a second via hole in areas corresponding to the gate wiring and the data wiring respectively to expose the gate wiring and the data wiring, wherein a thickness of the insulating spacing layer in the peripheral area surrounding the display area on the array substrate is less than that of the insulating spacing layer in other areas; and forming patterns comprising a second transparent electrode, a first connection electrode and a second connection electrode, wherein the first connection electrode is connected to the gate wiring via the first via hole, and the second connection electrode is connected to the data wiring via the second via hole.

In one embodiment, for example, the process of forming patterns of an insulating spacing layer, a first transparent electrode and a passivation layer comprises: forming an insulating material film, and removing the insulating material film in areas corresponding to a connection area of the first transparent electrode and a drain electrode of the thin film transistor, corresponding to the gate wiring and corresponding to the data wiring by a patterning process to form patterns of a connection via hole, a first sub-via hole and a second sub-via hole; wherein the thickness of the insulating spacing layer in the PAD area on the array substrate is less than that of the insulating spacing layer in other areas to form the insulating spacing layer; forming a pattern of the first transparent electrode not in the peripheral area surrounding the display area by a patterning process, wherein the first transparent electrode is connected to the drain electrode of the thin film transistor via the connection via hole; and forming a passivation layer, and performing the etching process in areas corresponding to the first sub-via hole and the second sub-via hole respectively by a patterning process until the gate wiring and the data wiring are exposed respectively to form the first via hole and the second via hole.

In one embodiment, for example, the thickness of the insulating spacing layer in the peripheral area surrounding the display area on the array substrate is a half of the thickness of the insulating spacing layer in other areas.

In one embodiment, for example, the thickness of the insulating spacing layer not in the peripheral area surrounding the display area is 20000 Å to 30000 Å.

In one embodiment, for example, the insulating spacing layer is made of an organic material.

Another embodiment of the present disclosure provides an array substrate, comprising: a thin film transistor, a gate wiring and a data wiring formed on a base substrate, wherein the gate wiring and the data wiring are located in the peripheral area surrounding the display area of the array substrate; an insulating spacing layer located on the thin film transistor, the gate wiring and the data wiring; a first transparent electrode located on the insulating spacing layer and not in the peripheral area surrounding the display area; a second transparent electrode located on the first transparent electrode; a passivation layer disposed between the first transparent electrode and the second transparent electrode; a first via hole and a second via hole formed in the insulating spacing layer corresponding to the peripheral area surrounding the display area; and a first connection electrode and a second connection electrode formed on the insulating spacing layer and located in a same layer as the second transparent electrode; wherein a thickness of the insulating spacing layer in the PAD area is less than that of the insulating spacing layer in other areas; and the first connection electrode is connected to the gate wiring via the first via hole, and the second connection electrode is connected to the data wiring via the second via hole.

In one embodiment, for example, the thickness of the insulating spacing layer in the PAD area is a half of the thickness of the insulating spacing layer in other areas.

In one embodiment, for example, the first transparent electrode is connected to a drain electrode of the thin film transistor.

In one embodiment, for example, the first transparent electrode is a pixel electrode.

In one embodiment, for example, the second transparent electrode is a common electrode.

Another embodiment of the present disclosure further provides a display device comprising one of the above-mentioned array substrates.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 1:
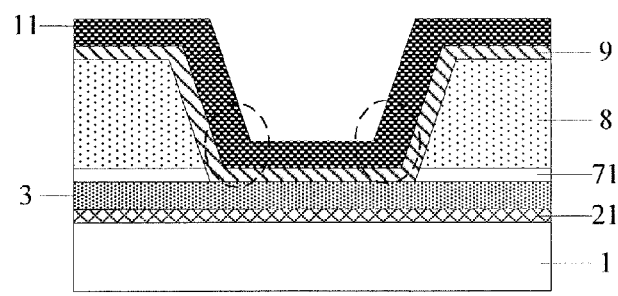
FIG. 1 is a schematic view showing that a pixel electrode is etched in a PAD area of an array substrate.
Figure 2:
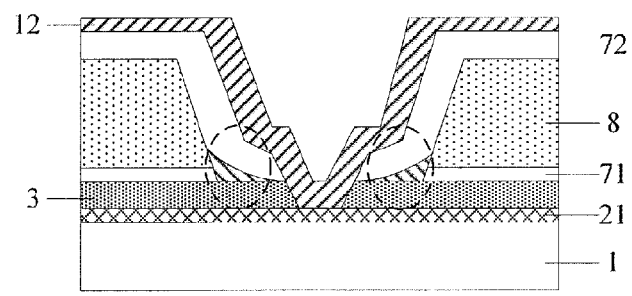
FIG. 2 is a schematic view showing that a first connection electrode is formed in a PAD area of an array substrate.

FIG. 1 and FIG. 2 are layer structure schematic views showing the wiring-arrangement area in a peripheral area (PAD area) surrounding a display area of an array substrate. The structure in FIG. 1 from bottom to top in turn is: a base substrate 1, a gate wiring 21, a gate insulating layer 3, a first passivation layer 71, an organic insulating layer 8 and a via hole therein, a pixel electrode 9 (the electrode material is indium tin oxide (ITO)) and a photoresist layer 11. Because the thickness of the organic insulating layer 8 is ten times larger than other layers, so a deeper hole is formed at the via hole for the wiring in the PAD area. In this way, in the subsequent process to manufacture a pattern of the pixel electrode 9 by exposure, the thicker organic insulating layer leads to insufficient exposure when the photoresist layer on the first transparent electrode is subjected to irradiation of vertical light. Therefore, a portion of the photoresist remains at the bottom of the via hole (the area shown in the dashed ellipse box in FIG. 1). Furthermore, in the subsequent wet etching process, a portion of ITO (Indium Tin Oxide) remains in the via hole because of the residue of the photoresist.

As shown in FIG. 2, a second passivation layer 72 is deposited after the pixel electrode 9 is etched, then the second passivation layer 72 and the gate insulating layer 3 at the via hole are etched. The residue of the ITO, which remains when the pixel electrode 9 is etched, leads to consequence that only the area of the gate insulating layer 3 that is within the via hole and uncovered by the residue of ITO is etched during the process when the gate insulating layer 3 is etched. Therefore, after a first connection electrode 12 is deposited, the contact area of the first connection electrode 12 with the gate wiring 21 is obviously reduced compared with the designed contact area of the first connection electrode 12 with the gate wiring 21. Here, the connection electrode connected to the gate metal layer is formed with the common electrode at the same time, and the material of these electrodes is indium tin oxide (ITO). The decreased contact area leads to insufficient contact, which brings about defects, such as undesirable bright line and abnormal lighting, to a screen and also is undesirable for bad check (detection) of the product and improvement of yield. Moreover, if the organic insulating layer in the peripheral wiring-arrangement area is removed, the resulted large step will lead to abnormality in the subsequent assembly process when an alignment film is rubbed, uneven display will be caused.

As shown in FIG. 3 to FIG. 6, the manufacturing method of an array substrate in at least one embodiment of the present disclosure comprises the following steps.

Step 1: forming patterns comprising a thin film transistor (TFT), a gate wiring 21 and a data wiring 61 on the base substrate 1, wherein the gate wiring 21 and the data wiring 61 are located in a PAD area of the array substrate;

In one embodiment of the present disclosure, a thin film transistor is formed in a non-PAD area (that is, a display area) and the TFT comprises: a gate electrode 2, a gate insulating layer 3, an active layer 4, a source electrode 5 and a drain electrode 6. In one embodiment of the present disclosure, the gate wiring 21 and the gate electrode 2 are formed in a same layer. The data wiring 61, the source electrode 5 and the drain electrode 6 are formed in a same layer. The display area is located in the central portion of the array substrate used for a liquid crystal display, for example, surrounded by the non-display area. The display area comprises a plurality of sub-pixel units arranged in an array. Each sub-pixel unit comprises a TFT as a switching element.

Step 2: forming patterns of an insulating spacing layer 8, a first transparent electrode and a passivation layer 72, thereby the thickness of the insulating spacing layer in the PAD area on the array substrate 1 is less than that of the insulating spacing layer in other areas, and forming a first sub-via hole 15' and a second sub-via hole 16' in the areas corresponding to the gate wiring 21 and the data wiring 61 respectively to expose the gate wiring 21 and the data wiring 61.

In one embodiment of the present disclosure, one example of step 2 is described as below. An insulating material film is formed by a patterning process comprising photoresist coating, exposure, development, etching, photoresist stripping and the like (for example, a half tone mask can be used) to remove the insulating material film in the areas corresponding to the connection area of the first transparent electrode and the drain electrode of a TFT, corresponding to the gate wiring 21 and corresponding to the data wiring 61 to form patterns of a connection via hole 14, a first sub-via hole 15' and a second sub-via hole 16'. The thickness of the insulating spacing layer in the PAD area on the array substrate 1 is less than that of the insulating spacing layer in other areas to form the insulating spacing layer 8. The insulating spacing layer can increase the distance between the pixel electrode and source/drain electrode, reduce the parasitic capacitance, and decrease the power dissipation.

In another example of the present disclosure, compared with the previous example, before the insulating material film is formed, a first passivation layer 71 is further formed on the array substrate, that is, the insulating material film is formed on the first passivation layer 71, so in the subsequent patterning process, the insulating material film and the passivation layer 71 are patterned at the same time to remove the insulating material film and the passivation layer 71 in the corresponding areas to form the patterns of the connection via hole 14, the first sub-via hole 15' and the second sub-via hole 16'. The thickness of the insulating spacing layer in the PAD area on the array substrate 1 is less than that of the insulating spacing layer in other areas. Correspondingly, the thickness of the insulating material film and the first passivation layer 71 in the PAD area on the array substrate 1 is less than that of the insulating material film and the first passivation layer 71 in other areas.

Figure 3:
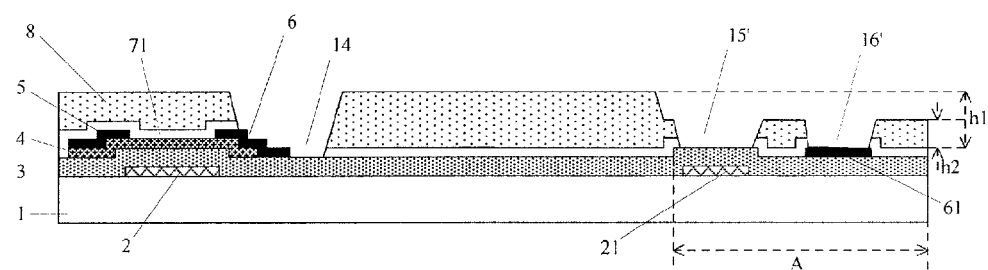
FIG. 3 is a schematic view showing that an insulating spacing layer is formed by the manufacturing method in an embodiment of the present disclosure.

FIG. 3 shows the patterns after the insulating spacing layer 8 is formed, the thickness h2 of the insulating spacing layer 8 in the PAD area A is less than the thickness h1 of the insulating spacing layer 8 in other areas. In one example, the thickness h2 may be a half of h1. In one example, in order to decrease the capacitance and the resistance between conductive layers in a high PPI array substrate, the thickness of the insulating spacing layer 8 in the non-PAD area, for example, may be 20000 Å to 30000 Å. For example, the insulating spacing layer 8 may be made of an organic insulating material.

Figure 4:
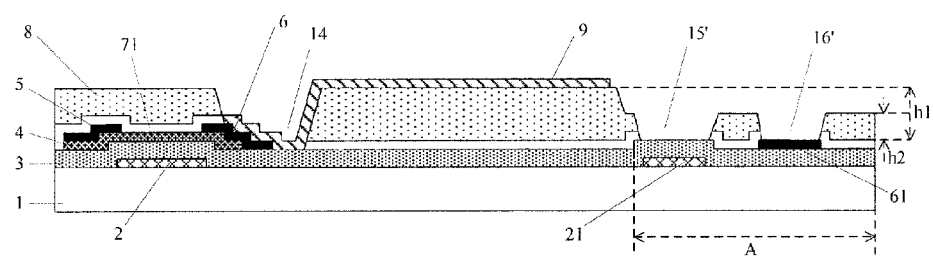
FIG. 4 is a schematic view showing that a pixel electrode is formed on the array substrate shown in FIG. 3.

After the insulating spacing layer 8 is formed, the pattern of a first transparent electrode is formed in the non-PAD area by a patterning process. As shown in FIG. 4, in one embodiment of the present disclosure, the first transparent electrode is a pixel electrode 9, the pixel electrode 9 is connected to the drain electrode 6 of the TFT via a connection via hole 14. In one embodiment of the present disclosure, the process of forming the pixel electrode 9 comprises the following process.

An ITO film is deposited on the surface of the base substrate after an insulating spacing layer 8 is formed thereon; correspondingly, the ITO film is deposited within the first sub-via holes 15' and the second sub-via holes 16'. The pattern of the pixel electrode as shown in FIG. 4 is formed by a patterning process. In the patterning process, because the thickness of the insulating spacing layer 8 in the PAD area is relatively smaller, the thickness of the first sub-via holes 15' and the second sub-via holes 16' is also small. The photoresist in these holes can be exposed sufficiently so as to be removed subsequently. Therefore, there will be no residue of the ITO as shown in FIG. 2 when the ITO in the first sub-via hole 15' and the second sub-via hole 16' are etched.

In one example, when the insulating spacing layer 8 is formed, the thickness h2 is a half of h1, so that the photoresist can be exposed sufficiently and the ITO is not prone to leave within the via hole. It is convenient to realize the patterning process with a half-tone mask patterning process. Meanwhile, the abnormal rubbing mura will be avoided (if the thickness difference is too large, for example, more than 2 μm, it is prone to generate abnormal rubbing mura).

Figure 5:
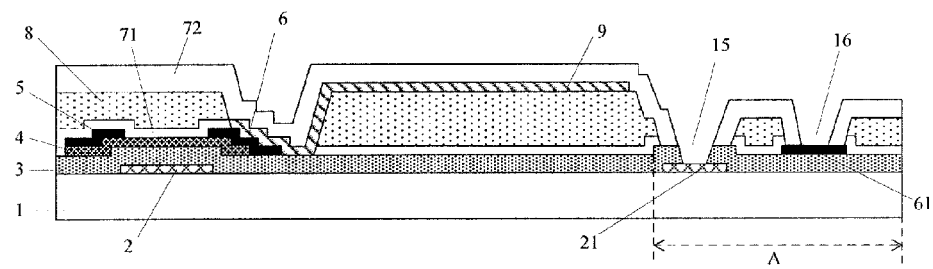
FIG. 5 is a schematic view showing that a passivation layer is formed on the array substrate shown in FIG. 4.

As shown in FIG. 5, after the pixel electrode 9 is formed, a second passivation layer 72 with a certain thickness is formed thereon, for example, the thickness of the second passivation layer 72 may be 2000 Å to 4000 Å. Etching is performed in the areas corresponding to the first sub-via hole 15' and the second sub-via hole 16' by a patterning process respectively until the gate wiring 21 and the data wiring 61 are uncovered respectively to form the first via hole 15 and the second via hole 16.

Step 3: forming patterns comprising a second transparent electrode, a first connection electrode 12 and a second connection electrode 13, wherein the first connection electrode 12 is connected to the gate wiring 21 via the first via hole 15, and the second connection electrode 13 is connected to the data wiring 61 via the second via hole 16.

Figure 6:
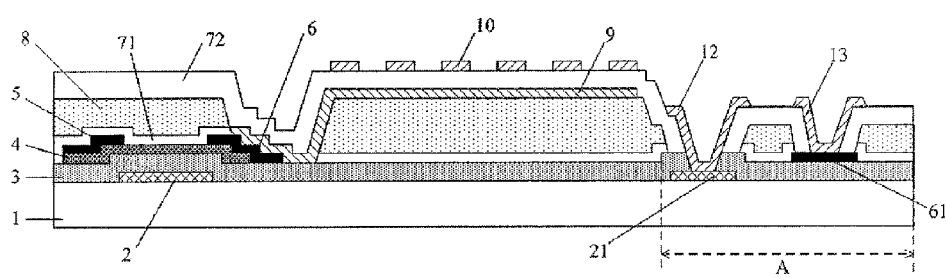
FIG. 6 is a schematic view showing that a common electrode, a first connection electrode and a second electrode are formed on the array substrate shown in FIG. 5.

As shown in FIG. 6, an example of step 3 comprises the following process.

An ITO film is formed on the second passivation layer 72, and the second transparent electrode, the first connection electrode 12 and the second electrode 13 are formed as shown in FIG. 6 by a patterning process. In one embodiment of the present disclosure, the second transparent electrode is a common electrode 10. For example, the common electrode 10 is connected to a common electrode line (not shown in the figure). The common electrode line, the gate wiring 2 and the gate wiring 21 are formed in the same process. The first connection electrode 12 is connected to the gate wiring 21 via the first via hole 15, the second connection electrode 13 is connected to the data wiring 61 via the second via hole 16. Finally, the array substrate as shown in FIG. 6 is formed.

Figure 7:
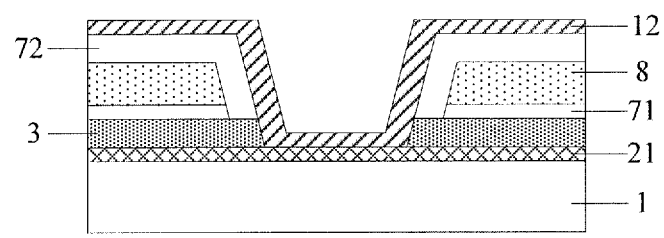
FIG. 7 is a schematic enlarged view showing the first via hole shown in FIG. 6.

Because the ITO used to manufacture the pixel electrode 9 will not be left over in the first sub-via hole 15' and the second sub-via hole 16' in step 2, as shown in FIG. 7, and therefore the first connection electrode 12 and the second electrode 13 have sufficient contact areas with the gate wiring 21 and the data wiring 61 respectively, so the undesirable high bright line and abnormal lighting of the display device can be reduced.

At least one embodiment of the present disclosure further provides an array substrate, as shown in FIG. 6. The array substrate comprises a thin film transistor, a first transparent electrode, a second transparent electrode, a gate wiring 21 and a data wiring 61 formed on the base substrate 1. The gate wiring 21 and the data wiring 61 are located in the PAD area of the array substrate. The thin film transistor is located in a sub-pixel unit of the display area. The array of the sub-pixel units, for example, is defined by the gate lines and the data lines that cross each other.

The array substrate further comprises an insulating spacing layer 8 located on the thin film transistor, the gate wiring 21 and the data wiring 61. For example, in another example, a first passivation layer 71 is formed between the thin film transistor, the gate wiring 21 and the data wiring 61, and the insulating spacing layer 8. The first transparent electrode is located in the non-PAD area on the insulating spacing layer 8 of the array substrate. The first transparent electrode may be a pixel electrode 9 and connected to the drain electrode 6 of the thin film transistor. The second transparent electrode may be a common electrode 10 and located on the pixel electrode 9. A second passivation layer 72 is disposed between the first transparent electrode and the second transparent electrode. The thickness of the insulating spacing layer 8 in the PAD area is less than that of the insulating spacing layer 8 in other areas.

The array substrate further comprises a first via hole 15 and a second via hole 16 which are formed in the insulating spacing layer 8 and in the areas corresponding to the PAD area, and a first connection electrode 12 and a second connection electrode 13 which are formed on the insulating spacing layer 8 and located in a same layer as the common electrode 10. The first connection electrode 12 and the second connection electrode 13 are connected to the gate wiring 21 and the data wiring 61 via the first via hole 15 and the second via hole 16 respectively.

In one embodiment, the thickness of the insulating layer 8 in the PAD area may be a half of the thickness of the insulating layer 8 in other areas.

An embodiment of the present disclosure further provides a display device comprising one of the above-mentioned array substrates. The display device can comprise any products or components having display function as follows:

liquid crystal panel, mobile phone, panel computer, TV set, display apparatus, laptop, digital photo frame, navigation or the like.

The manufacturing method of the array substrate of the present disclosure achieves that a thin insulating layer is formed in the peripheral area (PAD area) outside a display area, so that the connection electrode formed in the PAD area can fully contact with the corresponding signal line, and the abnormal rubbing mura will not be caused in the subsequent rubbing process, and the detection rate will be increased.

What are described above is related to the illustrative embodiments of the disclosure only and not limitative to the scope of the disclosure; various changes and modifications can be made by the skilled in the art to the present disclosure, without departing from the spirits and the scope of the present disclosure. Therefore, so far as these changes and modifications fall in the scope of the claims and their equivalents of the present disclosure, the resent disclosure shall also intend to cover such changes and modifications. The scopes of the disclosure are defined by the accompanying claims.

The application claims priority under 35 U.S.C. 119 to Chinese Patent Application No. 201310689196.5, filed on Dec. 16, 2013, which is hereby incorporated by reference in its entirety.

What is claimed is:

1. A manufacturing method of an array substrate, the array substrate being provided with a display area and a peripheral area, and the display area comprising a plurality of sub-pixel units arranged in an array, each sub-pixel unit comprising a thin film transistor as a switch element, the display area being surrounded by the peripheral area, the method comprising:
forming patterns comprising the thin film transistor of each sub-pixel unit, a gate wiring and a data wiring on a base substrate, wherein the gate wiring and the data wiring are located in the peripheral area surrounding the display area of the array substrate;
forming patterns of an insulating spacing layer, a first transparent electrode and a passivation layer, and forming a first via hole and a second via hole in areas corresponding to the gate wiring and the data wiring respectively to expose the gate wiring and the data wiring, wherein a thickness of the insulating spacing layer in the peripheral area surrounding the display area on the array substrate is less than that of the insulating spacing layer in other areas; and
forming patterns comprising a second transparent electrode, a first connection electrode and a second connection electrode, wherein the first connection electrode is connected to the gate wiring via the first via hole, and the second connection electrode is connected to the data wiring via the second via hole.

2. The manufacturing method of an array substrate according to claim 1, wherein forming patterns of an insulating spacing layer, a first transparent electrode and a passivation layer comprises:
forming an insulating material film, and removing the insulating material film in areas corresponding to a connection area of the first transparent electrode and a drain electrode of the thin film transistor, corresponding to the gate wiring and corresponding to the data wiring by a patterning process to form patterns of a connection via hole, a first sub-via hole and a second sub-via hole, wherein the thickness of the insulating spacing layer in the peripheral area surrounding the display area on the array substrate is less than that of the insulating spacing layer in other areas to form the insulating spacing layer;
forming a pattern of the first transparent electrode not in the peripheral surrounding the display area by a patterning process, wherein the first transparent electrode is connected to a drain electrode of the thin film transistor via the connection via hole; and
forming a passivation layer, and performing the etching process in areas corresponding to the first sub-via hole and the second sub-via hole respectively by a patterning process until the gate wiring and the data wiring are exposed respectively to form the first via hole and the second via hole.

3. The manufacturing method of an array substrate according to claim 2, before forming the insulating material film, further comprising forming a first passivation layer on the patterns of the thin film transistor, the gate wiring and the data wiring.

4. The manufacturing method of an array substrate according to claim 2, wherein the thickness of the insulating spacing layer in the peripheral area surrounding the display area on the array substrate is a half of the thickness of the insulating spacing layer in other areas.

5. The manufacturing method of an array substrate according to claim 2, wherein the thickness of the insulating spacing layer not in the peripheral area surrounding the display area is 20000Å to 30000Å.

6. The manufacturing method of an array substrate according to claim 1, wherein the insulating spacing layer is made of an organic material.

7. The manufacturing method of an array substrate according to claim 3, wherein the thickness of the insulating spacing layer in the peripheral area surrounding the display area on the array substrate is a half of the thickness of the insulating spacing layer in other areas.

8. An array substrate, the array substrate being provided with a display area and a peripheral area, and the display area comprising a plurality of sub-pixel units arranged in an array, each sub-pixel unit comprising a thin film transistor as a switching element, the display area being surrounded by the peripheral area, the array substrate comprising:
the thin film transistor of each sub-pixel unit, a gate wiring and a data wiring formed on a base substrate, wherein the gate wiring and the data wiring are located in the peripheral area surrounding the display area of the array substrate;
an insulating spacing layer located on the thin film transistor, the gate wiring and the data wiring;
a first transparent electrode located on the insulating spacing layer and not in the peripheral display area surrounding the display area;
a second transparent electrode located on the first transparent electrode;
a passivation layer disposed between the first transparent electrode and the second transparent electrode;
a first via hole and a second via hole formed in the insulating spacing layer corresponding to the peripheral display area surrounding the display area; and
a first connection electrode and a second connection electrode formed on the insulating spacing layer and located in a same layer as the second transparent electrode;
wherein a thickness of the insulating spacing layer in the peripheral area is less than that of the insulating spacing layer in other areas; and the first connection electrode is connected to the gate wiring via the first via hole, and the second connection electrode is connected to the data wiring via the second via hole.

9. The array substrate according to claim 8, wherein the thickness of the insulating spacing layer in the peripheral display area surrounding the display area is a half of the thickness of the insulating spacing layer in other areas.

10. The array substrate according to claim 8, wherein the first transparent electrode is connected to a drain electrode of the thin film transistor.

11. A display device comprising the array substrate according to claim 8.

12. The array substrate according to claim 9, wherein the first transparent electrode is connected to a drain electrode of the thin film transistor.

* * * * *